United States Patent [19]

Bird

[11] Patent Number: 5,289,278
[45] Date of Patent: Feb. 22, 1994

[54] DUO-BINARY AND/OR BINARY DATA SLICER

[75] Inventor: Philip H. Bird, Swindon, England

[73] Assignee: Plessey Semiconductors Limited, England

[21] Appl. No.: 838,049

[22] Filed: Feb. 19, 1992

[30] Foreign Application Priority Data

Feb. 21, 1991 [GB] United Kingdom ............... 9103621

[51] Int. Cl.[5] .................................................. H04N 7/08
[52] U.S. Cl. ..................................... 348/473; 307/350; 307/351; 307/352
[58] Field of Search ................... 358/17, 153, 142; 375/17, 18, 19, 76; 307/350, 351, 352; H04N 7/08, 5/08

[56] References Cited

U.S. PATENT DOCUMENTS

| | | | |
|---|---|---|---|
| 3,600,688 | 8/1971 | Booth | 307/352 |
| 3,611,164 | 10/1971 | Day | 307/351 |
| 4,581,544 | 4/1986 | Feldman | 307/350 |
| 4,703,354 | 10/1987 | Auld | 358/153 |
| 4,707,730 | 11/1987 | Alard | 358/153 |
| 4,859,872 | 8/1989 | Hyakutake | 358/153 |
| 4,912,420 | 5/1990 | Parnell | 307/265 |

FOREIGN PATENT DOCUMENTS

| | | |
|---|---|---|
| 0063443 | 10/1982 | European Pat. Off. . |
| 0106316 | 4/1984 | European Pat. Off. . |
| 0338517 | 10/1989 | European Pat. Off. . |
| 0339727 | 11/1989 | European Pat. Off. . |
| 3838685 | 5/1990 | Fed. Rep. of Germany ........ 375/17 |
| 0097069 | 4/1988 | Japan ............................. H04N 5/08 |
| 0060132 | 3/1989 | Japan ............................. 375/17 |
| 0072784 | 3/1991 | Japan ............................. H04N 5/08 |
| 2029158 | 3/1980 | United Kingdom . |

Primary Examiner—James J. Groody
Assistant Examiner—Chris Grant
Attorney, Agent, or Firm—Kirschstein

[57] ABSTRACT

A duo-binary and/or binary data slicer has a data input (10) coupled via a capacitor (C1) to a d.c. restoring circuit (A2 to Q6 and Q9 to Q13) d.c. reference level is superimposed on the data signal. A sample and hold circuit (C2, Q15 to Q22) is arranged to sample the data signal and provide a voltage related to the upper and lower peak value. A divider (R16-R19) is coupled between the d.c. reference level and the voltage related to the upper and lower peak value and provides intermediate output voltages (DU, DL, B) relating to duo-binary and/or binary level for determining the slicing levels.

7 Claims, 3 Drawing Sheets

DUO-BINARY AND/OR BINARY DATA SLICER

BACKGROUND OF THE INVENTION

1. Field of the Invention

This invention relates to a duo-binary and/or binary data slicer and more particularly but not solely to such a slicer capable of slicing the sound/data burst portion of the signal of a multi-standard MAC receiver. The invention is suitable for applications to DMAC, D2MAC and CMAC receivers.

2. Description of Related Art

In order to evaluate a binary or duo-binary signal it is necessary to establish a reference value with which the signal is compared to determine whether the instantaneous value of an incoming signal is representative of a binary 0 or 1. One way of doing this is to employ a capacitor which is charged to the peak value of a data signal and to compare the instantaneous incoming signal with that peak value.

In the case of composite signals such as are transmitted by MAC television transmitters only a small part of the period of a line signal contains binary or duo-binary data for evaluation and the amplitude of such data is often less than the amplitude of the colour difference signal component and luminance signal component. This difference in amplitude makes it difficult to define a suitable reference level. The present invention seeks to overcome this problem.

SUMMARY OF THE INVENTION

According to the invention there is provided a duo-binary and /or binary data slicer comprising a data signal input coupled via a capacitor to a d.c. restoring circuit. A d.c. reference level is superimposed on the data signal. A sample and hold circuit is arranged to sample the data signal and provide a voltage related to the upper or lower peak value and divider means coupled between the d.c. reference level and the voltage related to the peak value which provides intermediate output voltages relating to duo-binary and/or binary level for determining the slicing levels.

Whilst the sampling of the data signal enables a voltage related to the peak value to be provided, difficulty can arise in maintaining that voltage during the period between sound/data bursts. One way of achieving this is to employ a capacitor. However, substantial charge storage is required in conventional circuits to maintain the peak value and implementation by way of integrated circuit structure requires an additional pin for attachment of an external capacitor. A refinement of the invention seeks to avoid such a requirement by providing, for the or each capacitor, a current mirror circuit arranged to inject current back into the capacitor the amount of which current is substantially equal to the current drawn therefrom. By such an arrangement a much smaller value of capacitor is required and this can be fabricated as part of an integrated circuit.

BRIEF DESCRIPTION OF THE DRAWINGS

In order that the invention and its various other preferred features may be understood more easily, embodiments thereof will now be described, by way of example only, with reference to the schematic circuit drawings, in which.

DETAILED DESCRIPTION OF THE PREFERRED EMBODIMENT

In the description which follows all transistors are NPN type unless specified otherwise.

Figure 1:
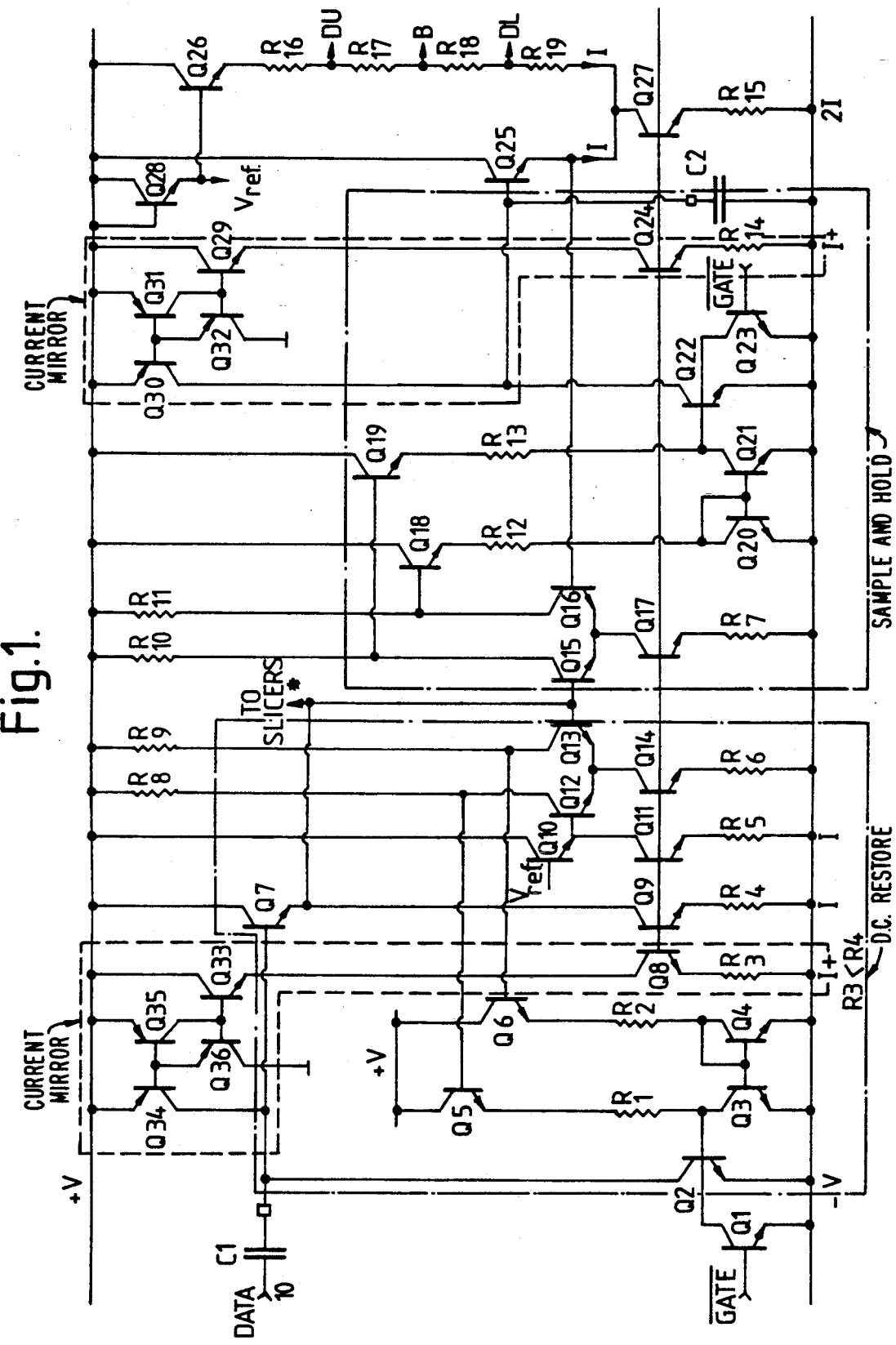
FIG. 1 is a slice level generator incorporating the principles of the present invention.

In the drawing of FIG. 1 a data input 10 is coupled via a capacitor C1 to the base of a transistor Q7 and also to the collector of a transistor Q2. The transistor Q2 has its emitter connected to a negative supply line $-V$ and its base connected to the collectors of transistors Q1 and Q3 each of which has its emitter connected to the negative supply line $-V$. The base of Q1 is connected to an input for a gating signal. The collector of Q3 is coupled via a resistor R1 to the emitter of transistor Q5 the collector of which is connected to a positive voltage supply line $+V$. The base of Q3 is connected to the base of Q4 the emitter of which is connected to $-V$. The base and collector of Q4 are connected so that it functions as a diode. The collector of Q4 is connected via a resistor R2 to the emitter of transistor Q6 the collector of which is connected to $+V$. The collector of Q7 is connected to $+V$ and its emitter is connected to the collector of a transistor Q9 the emitter of which is connected via a resistor R4 to $-V$ and to the slicers of FIG. 2. The base of Q9 is coupled to the bases of transistors Q8, Q11, Q14, Q17, Q24 and Q27. The emitter of Q8 is coupled via resistor R3 to $-V$ and its collector is connected to the emitter of PNP transistor Q33 the collector of which is connected to $+V$. The base of Q33 is connected to the base of PNP transistor Q36 and the collector of PNP transistor Q35. The emitter of Q35 is connected to $+V$ whilst its base is connected to the base of PNP transistor Q34 and the emitter of Q36 the collector of which is connected to $-V$. The emitter of Q34 is connected to $+V$ and the collector is connected to the line joining the capacitor C1 and base of Q7. The transistors Q8 and Q33 to Q36 form a current mirror circuit. The emitters of Q9, Q11, Q14, Q17, Q24 and Q27 are each coupled by a resistor R4, R5, R6, R7, R14 and R15 respectively to $-V$. The collector of Q11 is connected to the emitter of transistor Q10 the collector of which is connected to $+V$ and the base of which is provided with a d.c. reference voltage as hereinafter described. The emitter of Q10 is connected to the base of transistor Q12 the emitter of which is coupled to the collector of Q14 and the collector of which is coupled via a resistor R8 to $+V$. The emitter of Q12 is also connected to the emitter of transistor Q13 the collector of which is coupled via a resistor R9 to $+V$. The base of Q13 is connected to the base of transistor Q15 and to the emitter of Q7. The emitter of Q15 is connected to the emitter of transistor Q16 and also to the collector of Q17. The collectors of Q15 and Q16 are coupled to the bases of transistors Q18 & Q19 respectively the emitters of which are coupled via resistors R12 & R13 respectively to the collectors of transistors Q20 and Q21 respectively. The collectors of both Q18 & Q19 are connected to $+V$. The emitters of Q20 and Q21 are both connected to $-V$ and the base and collector of Q20 are connected together so that it functions as a diode. The collector of Q21 is connected to the base of transistor Q22 and to the collector of transistor Q23. The emitter of each transistor Q22 and Q23 is connected to $-V$. The base of Q23 is connected to an input for the gating signal. The collector of Q22 is connected to the collector of PNP transistor Q30 the base of which is connected to the base of PNP transistor Q31. The emitter of each of Q30 and Q31 are connected to +V. The collector of Q31 is connected to the base of PNP transistor Q32 and also to the base of transistor Q29. The collector of Q32 is connected to −V and its emitter is connected to the bases of Q3C and Q31. The emitter of Q29 is connected to the collector of Q24 and the collector of Q29 is connected to +V. A transistor Q28 operates as a diode having its base and collector connected to +V and its emitter connected to the base of Q10 providing a reference voltage Vref. The emitter of Q28 is also connected to the base of transistor Q26 the collector of which is connected to +V and the emitter of which is connected to one end of a series resistor voltage divider chain formed by resistors R16, R17, R18 and R19. The other end of the series resistor voltage divider chain is connected to the emitter of transistor Q25 and the collector of Q27. The collector of Q25 is connected to +V.

Figure 3:
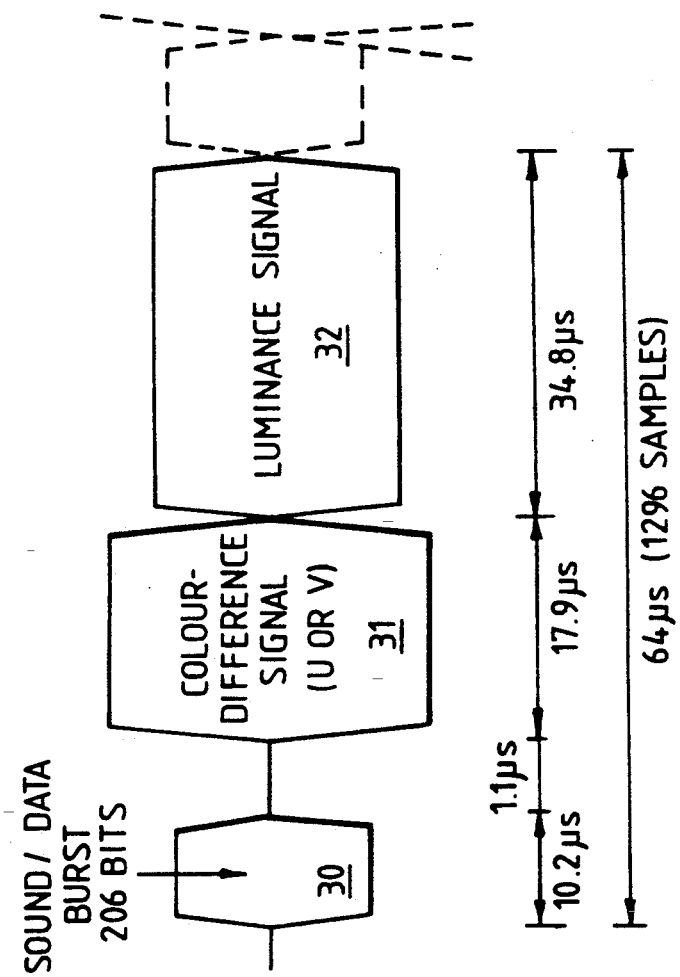
FIG. 3 illustrates the structure of a single line of a DMAC signal.

The circuit of FIG. 1 operates as follows. A data input signal, which in the described application is a composite signal transmitted by a DMAC television transmitter the form of which is illustrated in FIG. 3, is fed to the input 10. The signal contains, in the period of each line, a short interval 30 ( the data burst period) which may be in binary or duo-binary form, which constitutes sound and synchronizing data information, followed by longer intervals 31 & 32 constituting colour difference information and luminance signals respectively. During the intervals 31 and 32 the gate input to the base of Q1 is high which switches Q1 or and Q2 off and this allows the capacitor C1 to charge towards the supply voltage with a relatively long time constant of several milliseconds. During the interval 30 however, the gate input to the base of Q1 is low which switches the transistor off and Q2 is left to be controlled by the output voltage of Q3 which is itself controlled by the comparator formed by Q12, Q13 and their associated circuitry. The data input is ac coupled by C1 to the base of Q7 and appears on its emitter d.c. restored to a reference level 1Vbe down from V+by a d.c. restoring circuit comprising transistors Q2 to Q6 and Q9 to Q13. This value is applied to the base of Q13 forming one input to the comparator. The base current of Q33 is slightly greater than the base current of Q7. This current is mirrored back into the input to give a small positive draft. In this way a very small droop of voltage with time is achieved using a relatively small value capacitor without compromising headroom of the input to Q7 which appears to be a high impedance input. Q28 operating as a diode provides a d.c. reference voltage Vref which is 1Vbe down from V+ which is connected to the base of Q10 the emitter of which is connected to the base of Q12 forming the other input to the comparator. Each time the data at the input 10 goes above Vref, the comparator changes state The ECL signal on the collectors of Q12 & Q13 is converted to TTL levels by Q3 to Q6 and Q2 is turned on to pull down the input This pull down is disabled if Q1 is turned on by the gate input when it goes positive. The net effect is that the voltage on C1 does not exceed Vref and the value of signal on C1 will be around the reference voltage.

In a similar manner the voltage C2 also has a small positive drift as the base current in Q29 is slightly larger than the base current in Q25. It is provided with a current mirror circuit formed by the transistors Q24 and Q29 to Q32. The transistors Q15 to Q22 and the capacitor C2 constitute a sample and hold circuit which operates as follows: If the input goes below the voltage on C2, the comparator formed by Q15 and Q16 changes state. Q18 to Q21 produce a TTL signal which turns on Q22 to pull down the voltage on C2. This pull down is disabled if Q23 is turned on by the gate signal. The upper and lower reference levels of the input are thus Vref and the voltage held on C2 respectively. The two levels are buffered by Q26 and Q25 and a resistive divider chain R16, R17, R18 & R19 produces the binary and two duo-binary slice levels. To match the Vbe's of Q26 and Q25 their collector currents should be made equal by choosing the resistor values such that the current in the resistor chain is half that in Q27 and equal to that in Q7.

The voltage divider provides an output DU representative of an upper duo-binary slice level which is 75% of the peak value an output B which is a binary slice-level 50% of the peak value and an output DL which is a duo-binary slice level which is 25% of the peak value. These outputs are connected to the circuit of FIG. 2.

Figure 2:
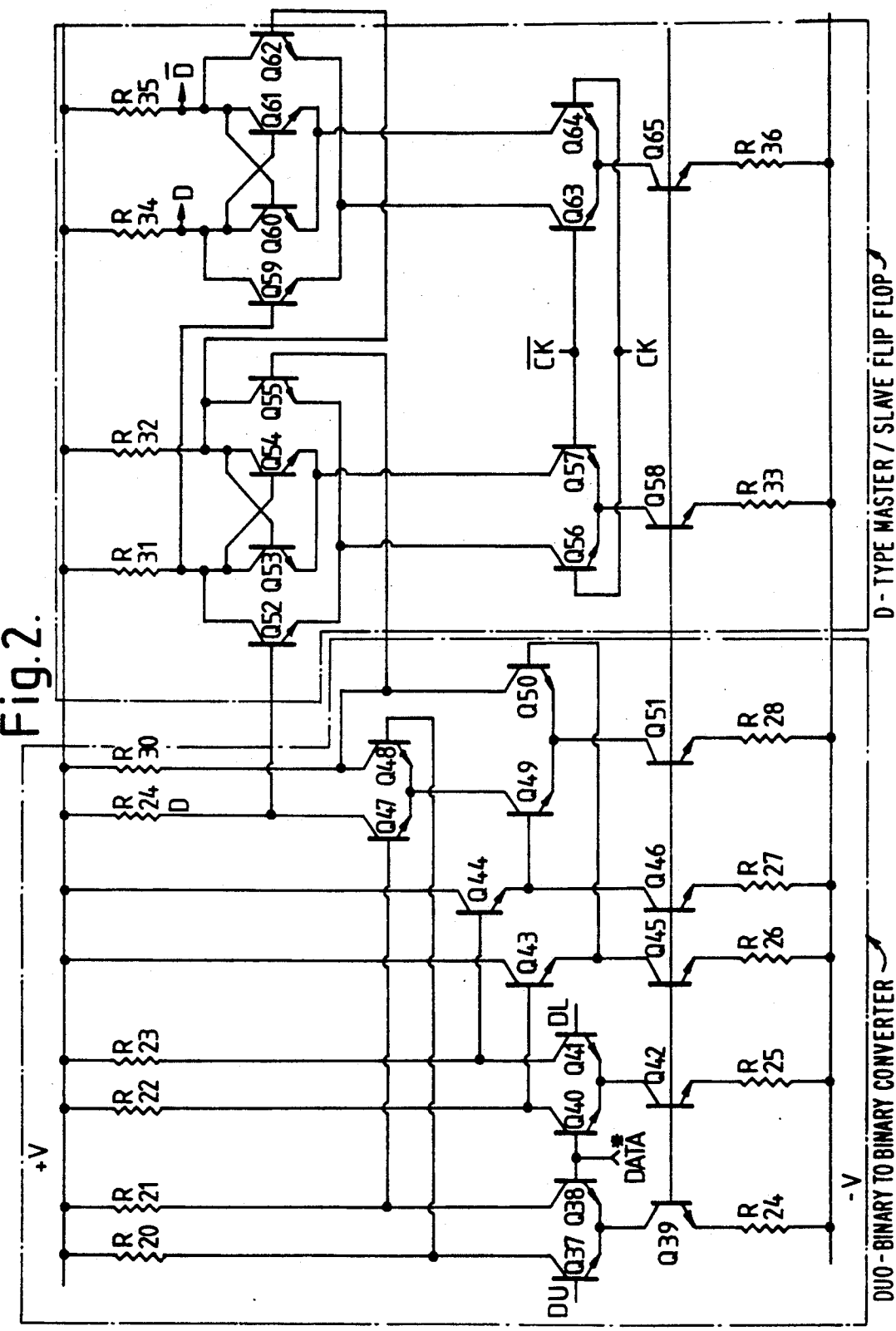
FIG. 2 is a data slicer driven by the circuit of FIG. 1.

Referring now to FIG. 2 a pair of transistors Q37, Q38 have their collectors connected to V+via resistors R20 & R21 respectively. Their emitter are connected to the collector of a transistor Q39 the emitter of which is connected to −V via resistor R24, the base of Q39 is connected to the bases of transistors Q42, Q45, Q46, Q51, Q58 and Q65 each of which has its emitters coupled to −V via a resistor R25, R26, R27, R28, R33 and R36 respectively. The collector of Q42 is connected to the emitters of Q40 and Q41 the collector of each of which is connected via a resistor R22 and R23 respectively to +V and to the base of a transistor Q43 and Q44 respectively. The collectors of Q43 and Q44 are both connected to +V. The emitters of Q43 and Q44 are each connected to the base of a transistor Q49 and Q50 respectively. The emitters of Q49 & Q50 are both connected to the collector of Q51. The collector of Q49 is connected to the joined emitters of transistors Q47 and Q48 the collectors of which are each coupled to +V via a resistor R29 and R30 respectively. The bases of Q47 and Q48 are each connected to on of the collectors of Q38 and Q37 respectively. The collector of Q47 is connected to a D type master slave latch comprising the transistors Q52 to Q65 and associated circuitry. The input is the base of Q52 the emitter of which is connected to the emitter of Q55 and the collector of Q56. The collector of Q52 is connected to the collector of Q53, which is coupled via a resistor R31 to +V and is also connected to the base of Q54 and to the base of Q59. The emitter of Q53 is connected to the emitter of Q54 and to the collector of Q57. The collector of Q54 is connected to the base of Q53, the base of Q62 the collector of Q55 and via a resistor R32 to +V. The collector of Q59 is connected to the collector of Q60, the base of Q61 and via a resistor R34 to +V. The emitter of Q60 is connected to the emitter of Q61 and collector of Q64. The collector of Q61 is connected to the base of Q60, the collector of Q62 and via a resistor R35 to +V. The emitter of Q62 is connected to the emitter of Q59 and collector of Q63. The base of Q64 is connected to the base of Q56. The transistors Q37 to Q46 and associated circuitry form a duo-binary data slicer whilst the transistor Q47 to Q51 and associated circuitry form a NAND gate.

The operation of the circuit duo-binary to binary converter comprising transistors Q37 to Q51 of FIG. 2 to reconstruct binary data from a duo-binary input employing the levels derived from FIG. 1 will now be described. The upper duo binary level DU is connected to the base of Q37 and the lower duo-binary level DL is connected to the base of Q41. The data signal input is fed to the joint bases of Q38 & Q40. The transistors Q37, Q38 & Q39 and associated circuitry and Q40, Q41 & Q42 and associated circuitry each form a comparator which compares the data input signal with the upper and lower duo-binary levels respectively. If the data amplitude is greater than the levels on the base of Q37 and Q41 then Q49 and Q48 are on and the collector of Q47 goes high. If the data amplitude goes below the level on the base of Q41, then Q50 is on and the collector of Q47 also goes high. However, if the data amplitude is below the level on the base of Q37 but above the level on the base of Q41, then Q49 and Q47 are on and the collector of Q47 will go low. Accordingly a logic 1 is produced if the amplitude of the data is above 75% or below 25% of the peak value and 0 if in between those values.

The data is synchronized to the system clock by the master slave latch comprising transistors Q52 to Q65 which is a D type circuit triggered by the system clock CK at 20.25 MHz and the output D, D are at 10 MHz of binary and not 5 MHz as in the case of the duo-binary signal.

Although the embodiment described effectively samples and holds the upper level of the signal it will be appreciated that the opposite arrangement is possible and is intended to fall within the scope of this invention.

Advantages of the construction described or its refinements are:

1. The mirroring of the base currents in Q7 and Q25 back into the capacitors C1 & C2 enable a very small droop in charge voltage t be achieved without using large capacitors and without compromising headroom on the input to Q7. Without such mirroring it would be necessary in the case of integrated circuit fabrication to provide extra pins for connection to external capacitors.
2. The circuit does not rely on accurately matched diodes pumping charge into capacitors. Instead, more accurate comparators are used to derive a logic signal which controls the charge on the capacitors. Accordingly, more accurate slice levels can be obtained giving a lower bit error rate for a given signal to noise ratio.
3. There are no slow PNP transistors employed in critical parts of the circuit thereby allowing slice levels to develop quickly. This feature is particularly important in such applications as MAC satellite television applications where fast acquisitions of line and frame lock are the key to a commercially acceptable solution.

I claim:

1. A duo-binary and/or binary data slicer, comprising: means for providing a d.c. reference voltage; a data signal input; means for coupling said data signal input via a capacitor to a d.c. restoring circuit, means for applying said d.c. reference voltage to said d.c. restoring circuit, said d.c. restoring circuit being arranged to superimpose a data signal received at said data signal input on said d.c. reference voltage; means for applying said superimposed data signal and reference voltage to a sample and hold circuit, said sample and hold circuit comprising at least one retention capacitor and means for establishing on one terminal of said retention capacitor a voltage related to a peak value of said superimposed data signal and reference voltage; divider means coupled with said means for providing a d.c. reference voltage and with said one terminal of said retention capacitor, said divider means being operative for providing intermediate output voltages for determining slicing levels; and, in respect of said at least one retention capacitor, a current mirror circuit operative for injecting into said retention capacitor an amount of current substantially equal to the current drawn therefrom by said divider means.

2. A data slicer as claimed in claim 1, wherein the sample and hold circuit comprises a gating circuit responsive to a gating signal determined by the data signal for enabling operation of the sample and hold circuit during periodic portions of the data signal.

3. A data slicer as claimed in claim 2 for a MAC television receiver, wherein the data signal has a burst portion at the start of a line, said burst portion activating the gating signal so that the upper or lower peak value during the data burst portion is sampled and held.

4. A data slicer as claimed in claim 1, wherein the intermediate output voltages provided by the divider means constitutes upper and lower duobinary levels and a binary level intermediate said duo-binary levels.

5. A data slicer as claimed in claim 4, wherein the upper and lower duo-binary levels are 75% and 25% of the voltage developed a cross the divider means.

6. A data slicer as claimed in claim 4, wherein the upper and lower duo-binary levels and the intermediate binary level are connected to different inputs of a duo-binary to binary converter which compares the data input signal therewith and provides a binary logic output signal having one binary state, if the amplitude of the signal is above the upper or below the lower duo-binary levels, and a logic signal of the opposite binary state, if the amplitude of the signal is between those two levels.

7. A data slicer as claimed in claim 6, wherein the logic output signal is coupled to an input of a D type master slave latch circuit which is triggered by a system clock of a MAC television receiver the latch thereby providing a data output which is synchronized with the clock.

* * * * *